United States Patent [19]

Berger et al.

[11] Patent Number: 4,797,560

[45] Date of Patent: Jan. 10, 1989

[54] MATRIX OF PHOTOSENSITIVE ELEMENTS AND AN ASSOCIATED READING METHOD IN IMAGE FORMATION

[75] Inventors: Jean L. Berger; Marc Arques, both of Grenoble, France

[73] Assignee: Thomson-CSF, Paris, France

[21] Appl. No.: 3,891

[22] Filed: Jan. 16, 1987

[30] Foreign Application Priority Data

Jan. 20, 1986 [FR] France ................. 86 00716

[51] Int. Cl.⁴ ............................................ H01J 40/14
[52] U.S. Cl. ................... 250/578; 358/213.28
[58] Field of Search ........... 250/578, 214 RC, 214 R, 250/211 J; 358/213.28, 213.31, 213.19; 357/30–32

[56] References Cited

U.S. PATENT DOCUMENTS

| | | | |
|---|---|---|---|
| 3,521,244 | 7/1970 | Weimer | 365/106 |
| 3,536,830 | 10/1970 | Hakki | 358/213.31 |
| 3,540,011 | 11/1970 | Stupp et al. | 358/213.31 |
| 4,400,409 | 8/1983 | Izu et al. | 427/39 |
| 4,495,409 | 1/1985 | Baji et al. | 250/211 J |
| 4,605,969 | 8/1986 | Green | 250/578 |
| 4,617,471 | 10/1986 | Suzuki et al. | 250/578 |

FOREIGN PATENT DOCUMENTS 1258572 12/1971 United Kingdom ............... 250/578

Primary Examiner—David C. Nelms
Assistant Examiner—Michael Messinger
Attorney, Agent, or Firm—Pollock, VandeSande & Priddy

[57] ABSTRACT

The invention provides a matrix of photosensitive elements in which each photosensitive element is reduced to the association of a diode and a capacity. The method for manufacture thereof is therefore easy particularly from amorphous silicon. The method for reading same uses multiplexed reading of the columns: the n columns are distributed in groups of n/M successive columns controlled simultaneously by M horizontal shift registers, each associated with a reading integrator. To ensure correct reading of the useful signal, whatever their level, the level of the voltages at the terminals of the diodes of the photosensitive elements is reset so that the starting voltage at the beginning of each reading pulse applied to a line is such that only this pulse, and even with a maximum useful illumination signal, can bias the diode forwardly, and so that with a column addressing pulse, the diode is biased forwardly even in the absence of the useful signal.

6 Claims, 5 Drawing Sheets

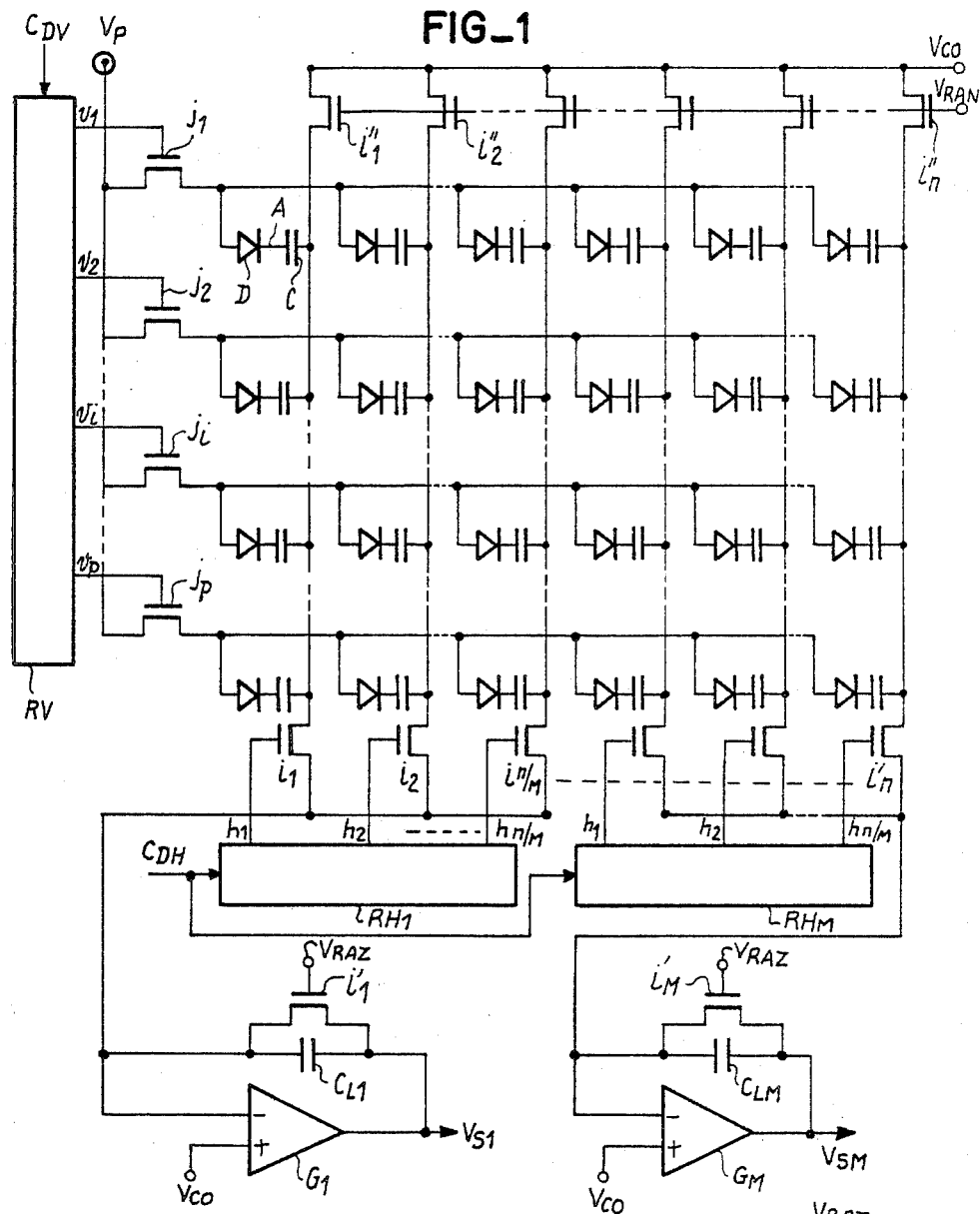
FIG_1
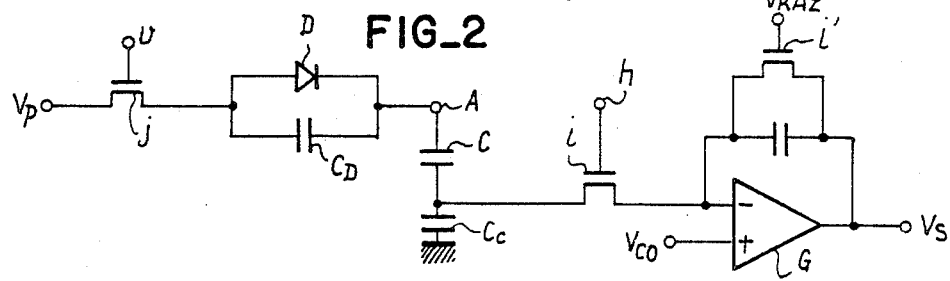
FIG_2

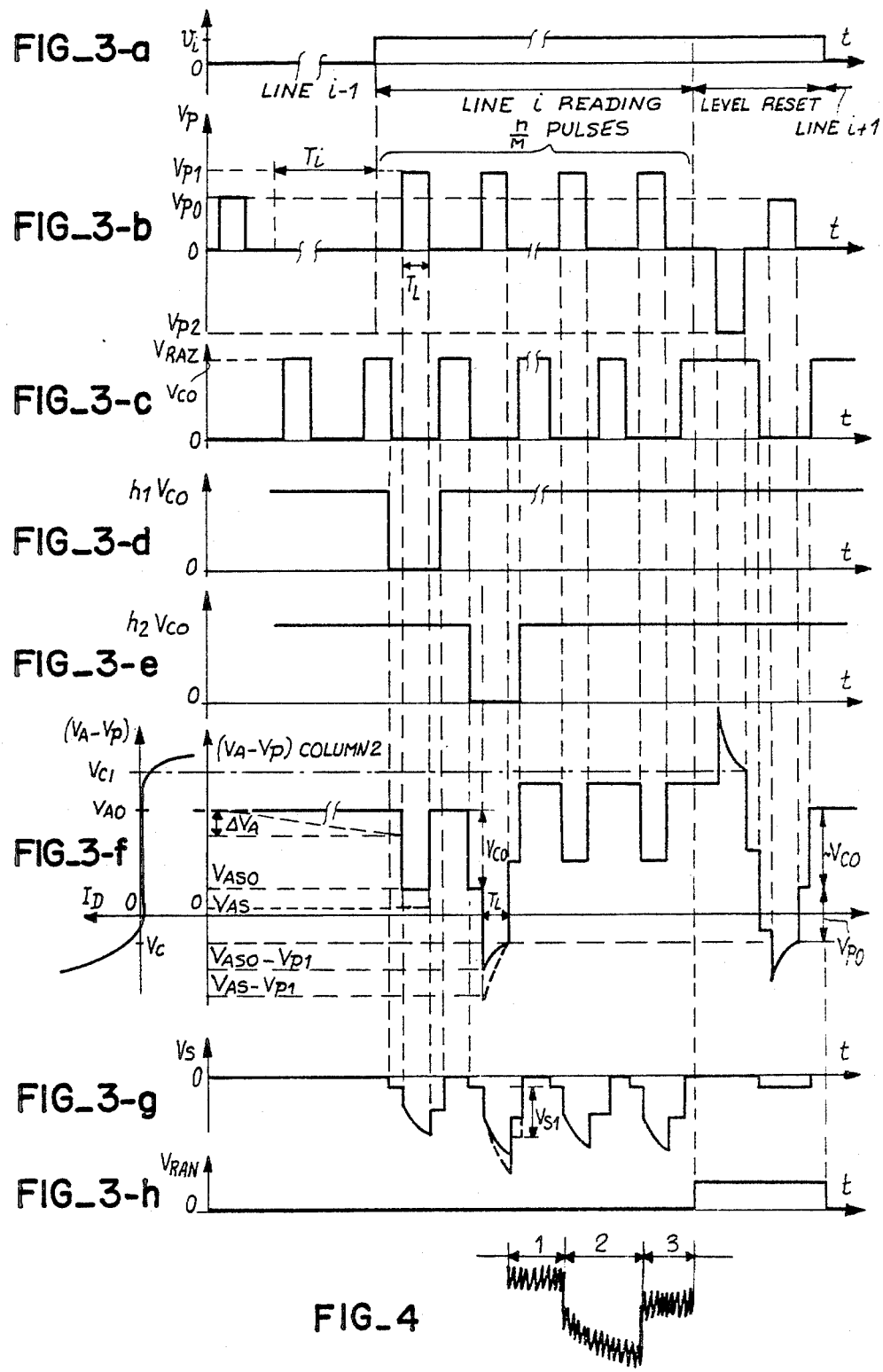

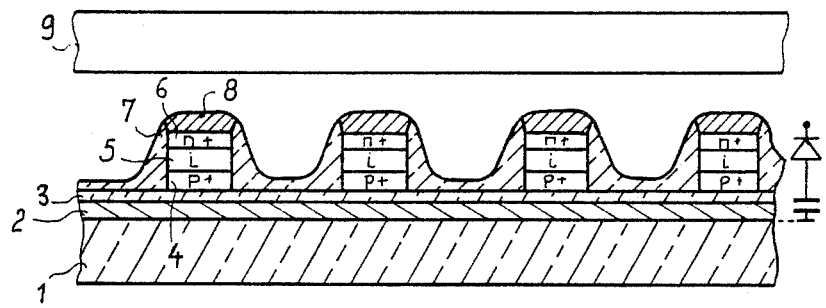
FIG_5-a
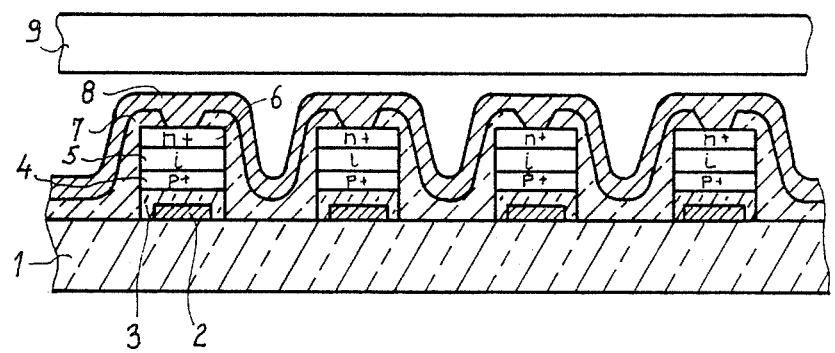
FIG_5-b
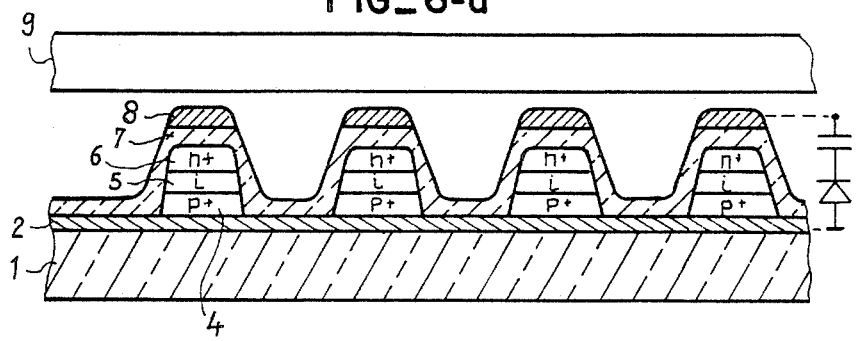
FIG_6-a
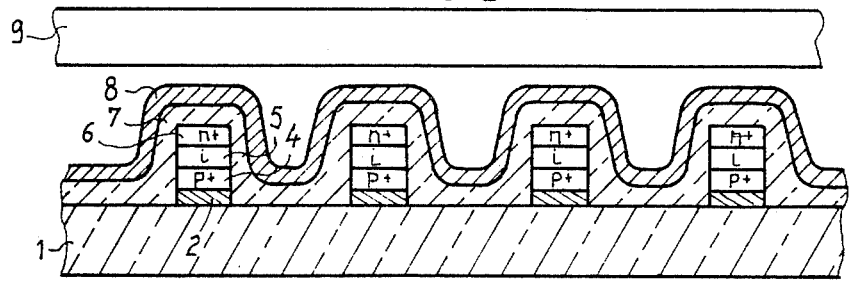
FIG_6-b

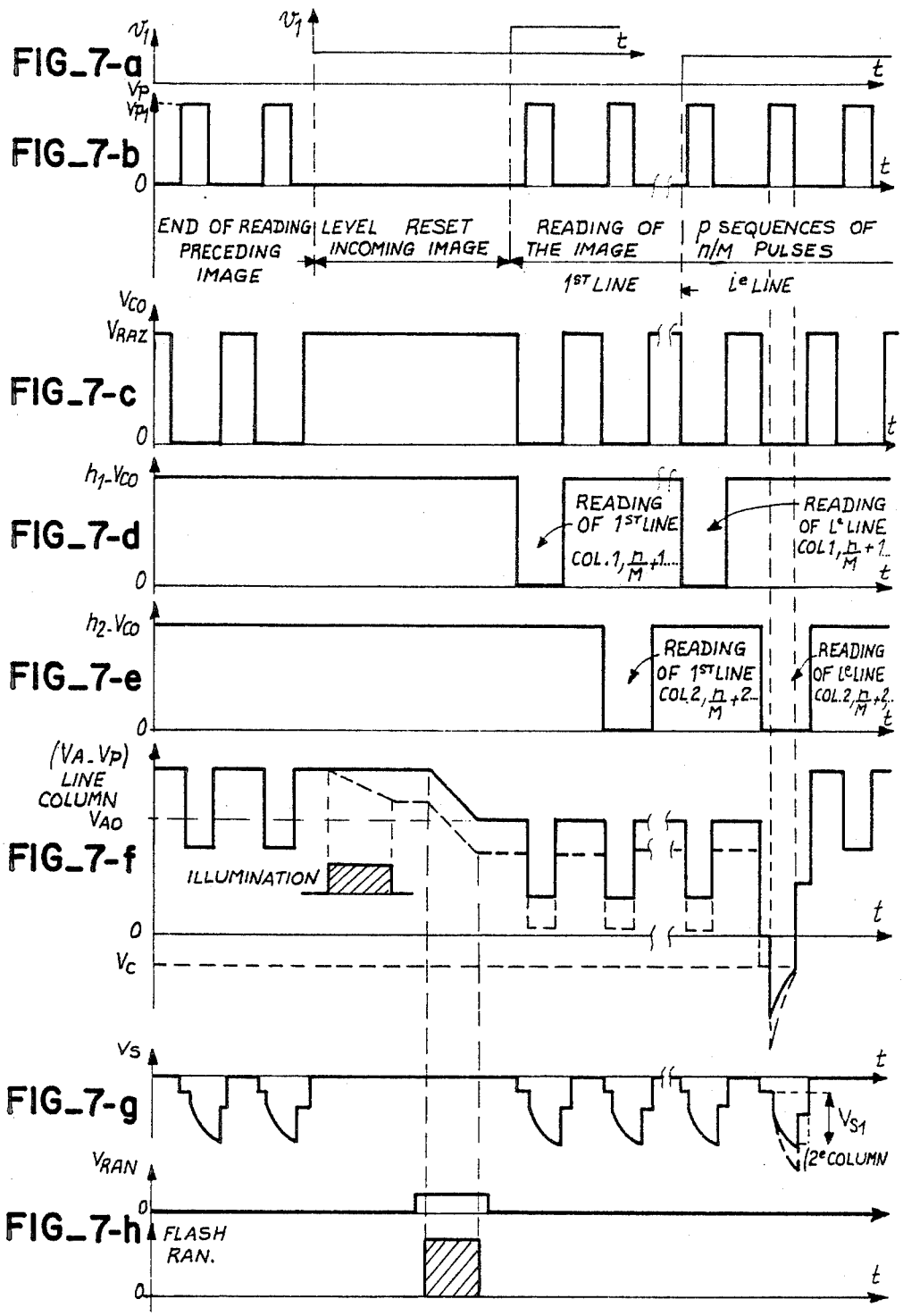

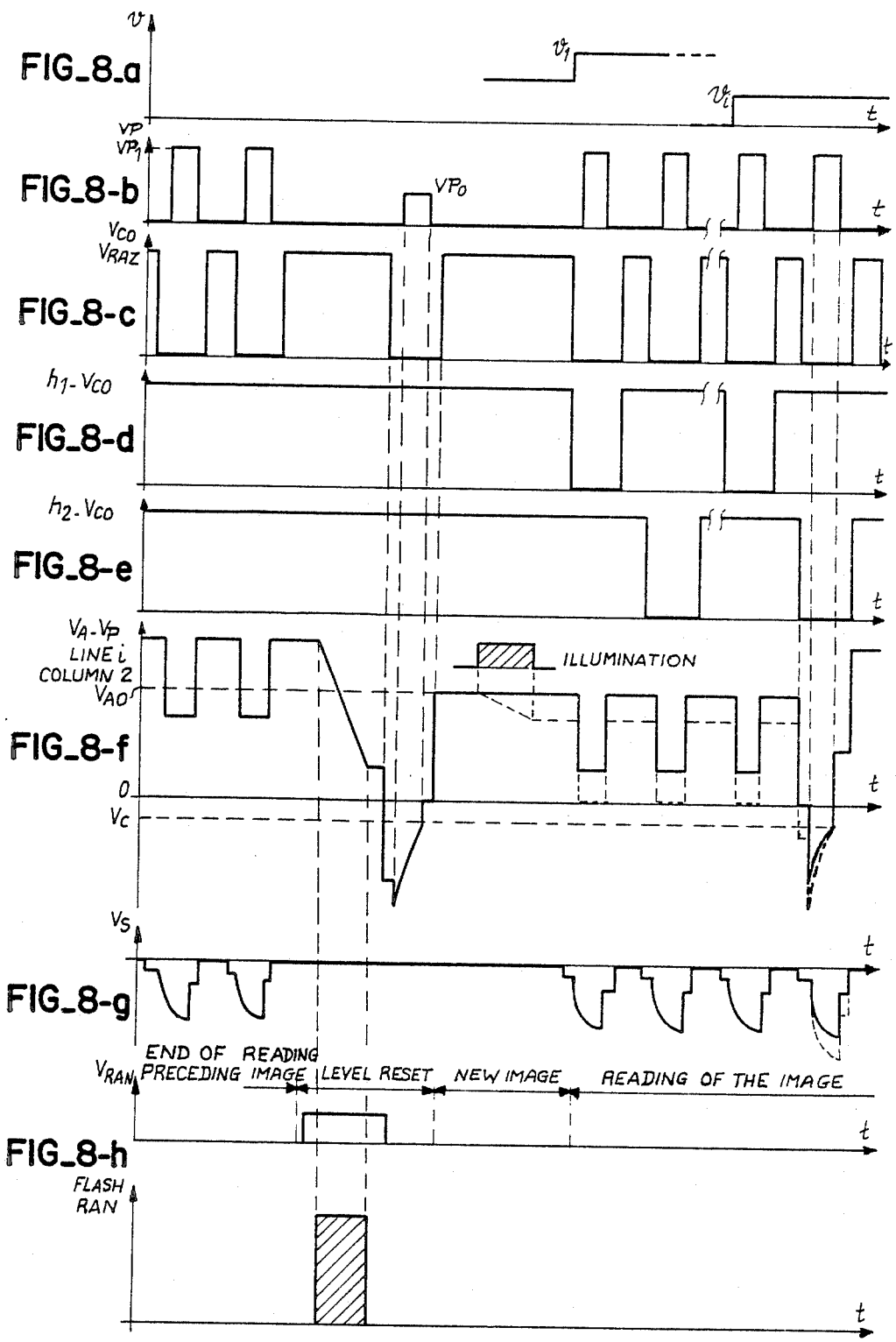

MATRIX OF PHOTOSENSITIVE ELEMENTS AND AN ASSOCIATED READING METHOD IN IMAGE FORMATION

BACKGROUND OF THE INVENTION

The invention relates to image forming techniques and more particularly to the formation of images, particularly for radiological images, using matrices of photosensitive elements.

The construction of a large sized matrix of photoelements poses numerous difficulties not only at the level of the structure of the photosensitive elements, which must be as simple as possible for reasons of manufacturing efficiency, but also during use of this matrix, i.e. in reading of the photosensitive elements in order to be time wise efficient (rapid) and with low noise.

SUMMARY OF THE INVENTION

A first object of the present invention is a matrix of interconnected photosensitive elements in which each element is limited to the association of a photodiode and a capacitance. The advantage of such a photosensitive element is that it is free of any switching element; it has then a high potential manufacturing efficiency. On the other hand, reading requires the use of an integrating operational amplifier and requires a relatively long time to be efficient and with low noise.

According to the invention, a matrix of photosensitive elements having an assembly of p lines of n photosensitive elements, each element has a first and second terminal, is characterized in that each element includes in series a photodiode and a capacitance, the first terminals of the elements of the same line being interconnected and connected via a switch controlled by an output of a vertical shift register to a line addressing potential, and the second terminals of the elements of the same column being interconnected and connected to a switch, controlled by an output of one of the M horizontal shift registers with n/M stages, in series with the "−" input of one of the M operational amplifiers connected as an integrator, the "+" inputs of the integrators being connected to the column addressing input, each column conductor being also connected, via a switch controlled by pulses for resetting the level of the column addressing input, the shift control inputs of the horizontal registers being connected to the same control input, each integrator including means for resetting integration capacitance.

A second object of the invention is a method for manufacturing this matrix.

According to the invention, a method for manufacturing such a matrix of photosensitive elements consists in depositing on a transparent substrate a first layer of semitransparent conducting material and etching it so as to obtain parallel conductors, in depositing on this assembly successive layers of semiconducting material, respectively doped, undoped and doped, required for forming photosensitive diodes, then etching them for isolating the diodes, in coating this assembly with a layer of dielectric material to form capacitances in series with the diodes, then, in depositing a layer of a semitransparent conducting material on the dielectric layer and etching it so as to form column conductors orthogonal to the line conductors and connecting together the capacitances of the same line.

Another object of the invention is the reading method associated with this photosensitive element matrix. Reading effects multiplexing of the columns of the matrix, so that the integrating amplifier operates under satisfactory conditions, without unduly increasing the number thereof.

According to the invention, the reading method associated with the matrix such as described above is characterized:

in that, for reading, the horizontal shift registers are controlled in parallel, with reading of the columns being multiplexed: the photosensitive elements of one line are addressed by an addressing voltage applied simultaneously to the columns of ranks, k, k+n/M, k+2n/M ..., by means of the outputs of rank k of the horizontal shift registers, k being an integer between 1 and n/M, a column addressing sequence including sequences of n/M pulses, in that a phase is provided for resetting the level of the voltages at the terminals of the diodes by applying a charge background of the photosensitive elements, between the reading sequences, so as to bring the voltage at the terminals of the diodes, of a line to be read, back to an initial value $V_{AO}$ such that the line-reading pulses alone cannot bias them forwardly even after maximum illumination, and so that the line control pulses associated with the column addressing pulses bias them heavily forwardly, even in the absence of useful radiation.

The last object of the invention is the application of this matrix to the formation of images, particularly radiological images.

BRIEF DESCRIPTION OF THE DRAWINGS

The invention will be better understood and other characteristics will appear from the following description with reference to the accompanying Figures, in which:

FIG. 1 shows a photosensitive element matrix of the invention, and the associated reading means;

FIG. 2 is a diagram of a detail of a photosensitive element and of the associated reading means;

FIGS. 3a to 3h show signals explanatory of the operation of the matrix of the invention with a first variant of the reading method;

FIG. 4 is a diagram of details of one of the signals described with reference to FIG. 3;

FIGS. 5a and 5b show sectional views, respectively along a column and along a line, of a matrix obtained with a first variant of the manufacturing method;

FIGS. 6a and 6b show sectional views, respectively along a column and along a line, of a matrix obtained according to a second variant of the manufacturing method;

FIGS. 7a, 7b ... 7h show signals explanatory of the operation of the matrix with a second variant of the reading method, FIGS. 8a, 8b ... 8h show signals explanatory of the operation of the matrix with a third variant of the reading method.

DESCRIPTION OF THE PREFERRED EMBODIMENTS

FIG. 1 shows a general view of the photosensitive matrix. A number n.p of photosensitive elements, each formed by a photodiode D in series with a capacitance, C, are arranged in the lines and columns of a matrix having p lines and n columns. The diodes of a same line are connected together by a line connection, whereas the capacitances C of the same column are connected together by a column connection. The line connections are connected to an addressing voltage $V_P$ through MOS switching transistors $j_1, j_2 \ldots j_p$ controlled by the outputs $v_1, v_2 \ldots v_p$ of a shift register called vertical shift register, RV. This register is controlled by a vertical shift control signal $C_{DV}$. Thus, when a line is selected to be read, all the diodes in this line are brought to the high level $V_{P1}$ of the addressing voltage $V_p$. Similarly, the capacitances of the same column are connected to the inputs of operational amplifiers connected as integrators, through MOS switching transistors $i_1, i_2 \ldots, i_n$ controlled by the outputs of the horizontal shift register stages.

According to the invention, the reading method includes multiplexing of the columns of the matrix so as not to use an integrating amplifier for each column: several successive columns are connected to the input of the same integrating operational amplifier. The reading means include then M amplifiers, M being a devisor of n, and M horizontal shift registers, each amplifier and the associated horizontal shift register being used for reading n/M columns. Thus, the first n/M columns are connected to the outpts of a horizontal shift register $RH_1$, with n/M stages the corresponding column connections being connected to the "−" input of an operational amplifier $G_1$ connected as an integrator: its output is connected to its "−" input through a reading capacitor $C_{L1}$. The "+" input of this integrator is connected to a column reference potential point $V_{CO}$.

This structure is repeated for each group of n/M columns, the last amplifier $G_M$ connecting together the last n/M columns. The integration capacitors $C_L$ are reset by switches $i'_1 \ldots i'_M$ controlled by resetting pulses $V_{RAZ}$. Finally, all the columns may be initialized together at the column reference potential $V_{CO}$ by a line of MOS transistors $i''_1, i''_2 \ldots i''_n$ controlled by level reset pulses $V_{RAN}$. The horizontal shift registers are controlled simultaneously by a horizontal shift control signal $C_{DH}$ applied to the control inputs, their outputs of the same rank being synchronous and delivering the signals $h_1, h_2 \ldots, h_{n/M}$. The output voltages of the integrating operational amplifiers are $V_{S1} \ldots V_{SM}$.

FIG. 2 shows in detail the equivalent diagram of a photosensitive element with photodiode D and capacitance C, with the different addressing controls and the corresponding output amplifier. When this photosensitive element is selected by the vertical register $R_V$ of FIG. 1, the corresponding switch j is closed by the control v and the potential $V_P$ is applied to a diode D. The capacitance $C_D$ of the diode has been shown in parallel across this diode D. The common point between the diode D and capacity C has been designated by A, the other end of capacitance C being connected to the "−" input of the integrating operation of amplifier G through the MOS switching transistor i controlled by the output h of a horizontal shift register selecting the column. Between this same terminal of C and ground has been shown the capacitance for the connection of columns $C_c$.

The diagrams of FIGS. 3a to 3h show the different signals applied or obtained during reading of a photosensitive element.

If we consider the operations for reading the ith line, all the diodes of this line have been reverse biased by the previous reading of this same line, a time $T_i$ beforehand, this time being at the minimum time required for reading all the other lines. The common point A between diode D and capacity C of the photosensitive elements of this line are then biased positively and left floating during the whole time $T_i$, this time being also used for integrating the light information to be recorded by this line. The photocurrent proper to each diode lowers the potential of each point A to a greater or lesser degree by discharging each capacitive pair formed by the capacity C and the capacitance of the diode $C_D$, as shown in FIG. 3f representing the voltage at the terminals of a diode, where the continuous line and broken lines show respectively the case where there is no useful line signal and the case where there is a useful line signal. $C_D$ is assumed small with respect to C, that is to say $C_D$ is less than or equal to C/IO.

The operations for reading the line are broken up into two successive sequences:

first of all the sequential reading of the information stored at points A of the different groups of n/M photosensitive elements, the M groups of columns being read simultaneously by means of the M horizontal shift registers and the M integrating amplifiers;

in a second phase, the simultaneous restoration of the initial potential $V_{AO}$ of points A of the whole line, by level resetting, either by means of a negative bias pulse applied to this line followed by blank reading, or by means of calibrated uniform illumination applied selectively to the line of photodetectors, or by means of an intense light flash followed by blank reading.

These two operations through routing of the addressing voltage $V_p$ over the ith line by the vertical shift register $R_V$ which controls the closing of switching of switch $j_i$ corresponding to this line: the voltage applied to the line, $V_P$ is zero during the whole time $T_i$ and equal to the high level of $V_p$, $V_{P1}$, during the duration of the reading pulses $T_L$ as shown in FIG. 3b. The first sequence of n/M reading pulses, synchronous with the reset pulses $V_{RAZ}$ short circuiting the reading capacitor $C_L$ and with the addressing pulses $V_{CO}.h$ applied to the positive inputs of the M amplifiers, as shown in FIG. 3c where $V_{CO}$ and $V_{RAZ}$ have been shown, and FIGS. 3d and 3e where the logic products $V_{CO}.h_1$ and the $V_{CO}.h_2$, have been shown corresponding to the addressing of the first two columns of each group. These column addressing pulses $V_{CO}.h$ result from the logic combination of pulses h controlling the switches i and of pulses applied to the reference potential point of the columns $V_{CO}$. The pulses h flank the pulses $V_{CO}$ so that, at the end of a reading time $T_L$, the column voltage has been brought back to the high level of $V_{CO}$ before level resetting. The zero resetting and column addressing pulses overflow on each side of the reading pulses $V_P$: the pulses $V_P$ pass to the high level $V_{P1}$ after the pulses $V_{CO}$ have passed to the low level. The reading pulses are therefore only transmitted to the selected columns by the horizontal shift registers, the other columns remaining charged at the high level of $V_{CO}$.

FIG. 3f describes the evolution of the potential $V_1 - V_p$ at the terminals of the diodes of columns 2, n/M+2, 2n/M+2 ... during addressing of the preceding columns 1, n/M+1, 2n/M+1 ..., with the other columns remaining at the high level, the pulse at $V_p$ must be of an amplitude $V_{P1}$ insufficient for biasing their diodes forwardly, in the absence of useful radiation, $V_{AS} \geq 0$, and also in the presence of radiation $V_{AS} \geq 0$. This is what appears in FIG. 3f where there has been shown, in addition to the voltage $V_a - V_p$ as a function of time, the characteristic of the diode: $I_D$ current in the diode as a function of $V_A - V_p$ voltage at its terminals. As mentioned above, the continuous line shows the potential in the absence of illumination, the broken line shows the potential of a diode having integrated a light information $Q_S$ during the integration period $T_i$. $\Delta V_1$ shows the amplitude of the signal stored on capacity C, the charges $Q_S$ being equal to $C \cdot \Delta V_A$.

The amplitude of the variation of the voltage at the terminals of the diode during passage from $V_p$ to the high level $V_{P1}$ is close to the amplitude variation of $V_p$. Reading of the following M columns, 2, n/M+2 ... is effected by the coincidence of a pulse $V_P$ with the corresponding addressing voltage shown by the logic product $V_{CO} \cdot h_2$ on these columns. In this case, the amplitude of the variation of the voltage at the terminals of the diode must be sufficient to bias the diode substantially forwardly, even in the absence of a useful light signal, to the level $V_{AS} - V_{P1}$, and of course in the presence of a signal $V_{AS} - V_{P1}$. If this condition is fulfilled, the voltage at the terminals of the diode evolves during the reading time $T_L$ to a value $V_C$ independent of the initial bias voltage and so of the signal. This voltage is the bent voltage of diode D. In this case, the signal charge is integrally transmitted to capacity $C_L$ of the corresponding integrating amplifier, whatever its amplitude. It is added to a charge $Q_O$ which is the charge read in the absence of signal. The integrator $G_1$, $G_{L1}$ then outputs a voltage $V_{S1}$ in the presence of a light signal on column 2 which corresponds to the useful charge $Q_S$ and to $Q_O$:

$$\frac{Q_S + Q_O}{C_L}.$$

This voltage is directly available after the zero return of the voltage $V_p$ and may then be taken by a sampler before the zero return by $V_{RAZ}$. The signals $V_{CO}$ and $V_{RAZ}$ are in phase but may have different levels.

During the return of $h_2 \cdot V_{CO}$ to the high level, the diode D is more heavily biased in a reverse direction then initially because of the reading of the charge $Q_O + Q_S$. The potential of point A is in fact written $$V_A = V_{AO} + \frac{Q_O + Q_S}{C + C_D}.$$

During reading of all the other columns, the diode remains reverse biased without being affected by the potential variations of $V_P$.

After the n/M pulses of $V_p$, the sequence of reading the columns is finished for line i. The phase for resetting the level of all the floating points A of the diodes of this line is then carried out. The aim of this level resetting is to restore on the diodes a potential $V_{AO}$ such that the pulses of $V_P$ cannot bias them forwardly during reading even for maximum illumination, and at the same time as a sum of the amplitudes of $V_p$ and $V_{CO}$ biases them heavily forwardly even in the absence of a signal. This double condition allows the reading of each diode to be selected by the coincidence of the line control pulses, by $V_p$, and of the column control pulses by $V_{CO}$ as described above.

To obtain the required potential $V_{AO}$, it is first of all necessary to discharge the pair of capacitances C and $C_D$, which the preceding reading operation recharged to a voltage greater than $V_{AO}$ where the diode cannot be read suitably. Several methods are possible for carrying out this discharge: either the use of reverse conduction of the diode beyond a certain threshold, or an intense or uniform illumination depending on the application envisaged.

Using the reverse conduction threshold of the diode, the level resetting operation illustrated in the signal diagrams of FIGS. 3a to 3h consists in applying a negative pulse of amplitude $V_{P2}$ by $v_p$ which polarizes the diode beyond its reverse conduction threshold. This latter is discharged to the reverse bend voltage $V_{CI}$, independent of the initial voltage. During this operation as well as during the next one, all the columns are biased to the high level of $V_{CO}$ through MOS switching transistors $i''_1 \ldots i''_n$ controlled for level resetting by $V_{RAN}$. This operation of biasing beyond the reverse conduction threshold is followed by a "blank" reading sequence following which the final potential $V_{AO}$ may be adjusted by means of a reading pulse of given amplitude $V_{PO}$. Thus, the bias charge $Q_O$ is adjusted independently of the reverse bend voltage value of the diode, which may vary substantially from one element to another, so that $V_C + V_{PO} + V_{CO} = V_{AO}$. After this sequence the floating potential of all the diodes of the ith line is restored so as to begin a new integration of light information.

A matrix of photosensitive elements, such as described above and shown schematically in FIG. 1, may be constructed following the method described below with reference to FIGS. 5a and 5b for a first embodiment or FIGS. 5a and 6b for a second embodiment. FIGS. 5a and 6a show the matrix in section through a column and FIGS. 5b and 6b show the matrix in section through a line respectively for the two embodiments of the method.

In the first embodiment, this matrix is formed from amorphous silicon in the following way: a glass plate 1 forming the substrate is coated in a first phase with a semitransparent conducting layer 2, for example molybdenum, tantalum or ITO (mixture of indium oxide and tin oxide), which is then etched so as to form the column conductors. A layer of dielectric material 3 is then formed for example tantalum oxide $Ta_2O_5$ with a high dielectric constant in a thickness of 0.2 micrometer obtained by anodic oxidation of the preceding layer if it is made from tantalum, so as to form the capacities C. Then on this layer are deposited layers of amorphous silicon for forming the PIN diodes D to a thickness on the order of 0.8 $\mu m$ to 3 $\mu m$: for example a layer of P+ doped silicon 4, a layer of intrinsic silicon i, 5, and a layer of n+ doped silicon 6. By etching the superimposed layers the diodes are isolated which are superimposed on the dielectric layer forming the capacitors and in contact with the lower conductor. An isolating protective layer 7, formed from silicon nitride or oxide for example, is then deposited; finally contacts are opened in the surface isolating layer 7 so as to form the line conductors. For that a layer of semitransparent metal 8, ITO for example, is deposited; this layer is then etched so as to form the line conductors.

For an application to X ray image formation, the scintillator screen 9 may then be deposited on the whole, the X ray image being projected on this face of the matrix. In the case where level resetting is provided by illumination as will be explained hereafter, the level resetting flash optics are projected on the glass plate 1 side, the scintillator being opaque to visible radiation.

In the second embodiment, illustrated in FIGS. 6a and 6b, where the same layers as in FIGS. 5a and 5b bear the same references, the diodes are formed before the capacities, the capacities being formed from the isolating layer 7, which avoids opening contacts in this layer and avoids the deposition of the isolating layer 3. Layer 7 may obviously no longer be formed by oxidation of the lower semitransparent conductor (tantalum). The succession of the layers is then as follows: on glass plate 1 is deposited a semitransparent conducting material 2 which is then etched, then the p doped silicon layer 4, the intrinsic silicon layer 5 and the n doped silicon layer 6. After etching for isolating the diodes, the dielectric material layer 7 is deposited and forms the capacity C. The last semitransparent conducting layer 8 is then deposited and etched.

Matrices of points can thus be readily formed in which each elementary zone has a side on the order of 100 microns to 200 $\mu$m and so matrices of $2000 \times 2000$ points to $4000 \times 4000$ points whose dimensions are on the order of 40 cm$\times$40 cm.

The structure thus obtained for the matrix and the associated reading method have several advantages in the case of a large sized matrix photosensor for which a high resolution is desired:

the reading noise may be reduced to a minimum;
the operating frequency of the horizontal shift registers may also be reduced by the factor M because of multiplexing;
the photosensitive element which is a capacity and diode association has a very simple x ray resistant structure, which is a major advantage for a sensor intended for X ray image formation, used for example with a scintillator.

Insofar as the reduction of the reading noise is concerned, a detail of the output voltage is shown in FIG. 4 where it is possible to distinguish the three zones with the corresponding noises. The noise of zone 1 is that corresponding to the charge of the column of capacity $C_c$, at the low level of $V_{CO}$, close to 0 V.

The noise of zone 2 is that of zone 1 to which is added the reading noise of the diode. It is possible to completely overcome the noise of zone 1 which comprises spatial (variations from one column to another) and time components, by using for reading the output voltage of the integrator a double sampling method which consists in storing the signal of zone 1 on a capacity and only reading the variation of signal from zone 1 to zone 3.

The noise of zone 1 depends on the input noise voltage of the amplifier, on its pass band B related to the reading time alloted to each column.

Multiplexing, made possible by the coincidence of voltage pulses $V_p$ and $V_{CO}$ applied respectively to the line and the columns, described above allows the pass band B to be reduced and so the noise voltage to be reduced accordingly by a factor $\sqrt{M}$, M being the multiplexing rate.

Insofar as the operating frequency of the horizontal shift registers is concerned, because of its reduction, the registers may be formed with transistors of reduced mobility, as is the case for photosensitive matrices using a material of the amorphous silicon type. This material is then used for the whole of the structure which considerably simplifies the connection problems.

It was pointed out above that the level resetting operation, indispensable so that reading may be repeated, could be carried out by uniformly illuminating the diodes so as to discharge them, such illumination having a predetermined intensity and duration. The signals explanatory of the variant of the reading method using such level resetting are shown in FIGS. 7a to 7h in the case of an application in which the level resetting is carried out at one and the same time for the whole matrix. The reference letters of FIGS. 7a to 7h and following are identical to those of FIGS. 3a to 3h and following for the same signal. The structure of the pulses $V_p$ is modified as shown in the curve of FIG. 7b: the negative pulse required on discharge for electric level resetting is suppressed; it is replaced by the calibrated illumination shown in FIG. 7h which discharges for a predetermined time all the diodes of the matrix after reading all the lines of the preceding image. It is this discharge which fixes the starting voltage $V_{AO}$; the blank reading pulse of amplitude $V_{PO}$ is also suppressed. The following reading pulses perform successive readings of the diodes of the matrix, in coincidence with the pulses $V_{CO}$ controlled by the horizontal registers. Each diode which has just been read must be sufficiently reversely biased so as to be no longer affected by the other pulses of the sequence. So that the diodes of this same line may be read by the coincidence $V_p$ and $V_{CO}$ intended for reading the following lines, it is important to choose the biasing charge background $Q_O$ higher than the maximum signal charge $Q_S$ (max) so that the potential of points A, after reading, $(V_A - V_p)T_L$ is always greater than $V_{AO}$. It is only after a new level resetting that the discharge leads to the potential of the floating points $V_{AO}$ suitable for reading. In this variant, contrary to the others, exposure to the useful radiation may take place after level resetting, as before, but may also take place before level resetting, or even at the same time, which may be the case for a permanent incoming image, in the case of a visible image forming device. The integration on each line then takes place during the reading of all the other lines, but between each reading of the whole matrix the level resetting sequence must take place.

Level resetting may also be obtained by means of an intense illumination. The signals explanatory of the variant of the reading method using such level resetting are shown in FIGS. 8a to 8h also in the case of an application in which level resetting is carried out for the whole panel at one and the same time. The intense uncalibrated illumination, illustrated by FIG. 8h, discharges the capacity C much more than would be necessary for coming back to the starting voltage $V_{AO}$. Then, a blank reading is carried out by means of an additional reading pulse shown in FIG. 8b, of a calibrated level $V_{PO}$, less than $V_{P1}$, similar to that introduced after heavily reverse biasing as shown in FIG. 3b. Thus, the voltage at point A of the diodes of the line to be read is brought back to the required starting voltage $V_{AO}$, without the illumination being calibrated. Then a bias charge $Q_O = C(V_{P1} - V_{PO})$ is introduced. Because blank reading is carried out for bringing the voltage to $V_{AO}$, integration of the useful information can only take place after the sequence for resetting the level of the whole of the panel.

The application of this matrix is radiological image formation is an application in which there is only a single exposure and a single reading of the matrix. In this case, the level resetting operation is carried out for the whole of the matrix, prior to the exposure as mentioned above. Reading may then be carried out line by line by electronic addressing.

For other applications, it is possible to provide line by line level resetting by focused illumination of the line for resetting to the level, or by calibrated illumination, or by intense illumination followed for this line by blank reading.

The invention is not limited to the above description, but in all cases the level resetting required so that the reading operation is carried out correctly whatever the level of the analog signal to be read by the integrating operational amplifier, must be adapted to the envisaged application.

What is claimed is:

1. A matrix of photosensitive elements including an assembly of p lines of n columns of photosensitive elements, each element having a first and second terminal, wherein each element includes in series a photodiode and a capacitor, said photodiode and capacitor connected to a common node, said photodiode having a forward threshold voltage beyond which it is conductive in a forward direction, said matrix comprising means for reverse biasing said photodiodes during an illumination phase, means for applying to said lines a periodic reading pulse after an illumination phase, means for setting on said common node, after each reading pulse, a constant biasing charge background, said constant biasing charge background being such that during a next reading pulse the photodiode is forward biased beyond its threshold voltage even when illumination is at a zero level during an illumination phase preceding said reading pulse.

2. A matrix of photosensitive elements according to claim 1, wherein said means for applying a reading pulse comprises means for applying to a line of photosensitive elements reading pulses of amplitude such that the photodiodes belonging to that line are not forward biased even for a maximum value of illumination during the preceding illumination phase, and means for simultaneously applying to a column of photosensitive elements reading pulses of opposite sign, of amplitude such that the conjunction of said reading pulses applied simultaneously to a line and to a column will forward bias beyond its threshold voltage a photodiode belonging to said line and column, even for a zero illumination level during the illumination phase.

3. A matrix according to claim 1, wherein said means for applying a constant biasing charge background comprises means for applying a level-resetting illumination flash which is transmitted to the photodiode after each read pulse.

4. A matrix according to claim 3, wherein said means for applying an illumination flash comprises means for supplying a flash calibrated in time-duration and in intensity, whereby a voltage at the terminals of the photodiode is restored to a predefined value by the level-resetting flash.

5. A matrix according to claim 3, comprising means for establishing a blank read phase without illumination after said flash, said blank read phase comprising applying a calibrated read pulse which restores the potential at the terminals of the photodiode to a predefined value.

6. A matrix according to claim 1, wherein the means for applying a constant biasing charge background comprises means for:
strongly reverse-biasing the photodiodes in order to exceed a reverse threshold voltage of said photodiodes and to discharge the associated capacitor to the value of said reverse threshold voltage, and
level-resetting by means of a calibrated read pulse,
a vertical shift register having p outputs, said first terminal of each photosensitive element of a given line being connected to a common respective output of the register, at least one horizontal shift register, said second terminal of each photosensitive element of a given column connected to a common respective output of the horizontal shift register.

* * * * *